United States Patent
Loo et al.

[11] Patent Number: 6,118,180
[45] Date of Patent: Sep. 12, 2000

[54] SEMICONDUCTOR DIE METAL LAYOUT FOR FLIP CHIP PACKAGING

[75] Inventors: Mike C. Loo, San Jose; Mike T. Liang, Milpitas; Ramoji K. Rao, Sunnyvale, all of Calif.

[73] Assignee: LSI Logic Corporation, Milpitas, Calif.

[21] Appl. No.: 08/963,553

[22] Filed: Nov. 3, 1997

[51] Int. Cl.[7] .......................... H01L 23/48; H01L 23/52; H01L 29/40
[52] U.S. Cl. .......................... 257/737; 257/738; 257/778; 228/180.22
[58] Field of Search ...................................... 257/737, 738, 257/778, 780, 781, 782, 784; 228/180.22; 438/613, 622, 626, 61

[56] References Cited

U.S. PATENT DOCUMENTS

| | | | |
|---|---|---|---|
| 5,162,264 | 11/1992 | Haug et al. | 438/613 |
| 5,220,199 | 6/1993 | Owada et al. | 257/773 |
| 5,726,501 | 3/1998 | Matsubara | 257/778 |

FOREIGN PATENT DOCUMENTS

| 401185952 | 7/1989 | Japan | 257/778 |
|---|---|---|---|

*Primary Examiner*—Mahshid Saadat
*Assistant Examiner*—Jhihan B. Clark
*Attorney, Agent, or Firm*—Beyer & Weaver, LLP

[57] ABSTRACT

Provided is a semiconductor flip chip die metal layout which provides a flat UBM where surface metal pads are narrower than UBMs in order to accommodate decreased die pitch. This is achieved by depositing a metal region adjacent to and closely spaced from the pad which, together with the pad, is capable of providing a substrate that will result in a substantially flat passivation layer surface on which the UBM is subsequently deposited. The adjacent closely spaced metal region may be provided by bringing metal traces closer to a reduced size surface metal pad (into the die surface area underlying the UBM), and/or by depositing dummy metal similarly near the pad. The dummy metal may also be deposited over the whole chip surface area not occupied by other electrical components.

21 Claims, 5 Drawing Sheets

SEMICONDUCTOR DIE METAL LAYOUT FOR FLIP CHIP PACKAGING

BACKGROUND OF THE INVENTION

This invention relates generally to semiconductor chips, and in particular to flip chip die layout. More specifically, the invention relates to a die metal layout useful for flip chip packaging.

In semiconductor device assembly, a semiconductor chip (also referred to as an integrated circuit (IC) chip or "die") may be bonded directly to a packaging substrate, without the need for a separate leadframe or for separate I/O connectors (e.g. wire or tape). Such chips are formed with ball-shaped beads or bumps of solder affixed to their I/O bonding pads. During packaging, the chip is "flipped" onto its active circuit surface so that the solder balls form electrical connections directly between the chip and conductive traces on a packaging substrate. Semiconductor chips of this type are commonly called "flip chips".

Figure 1A:
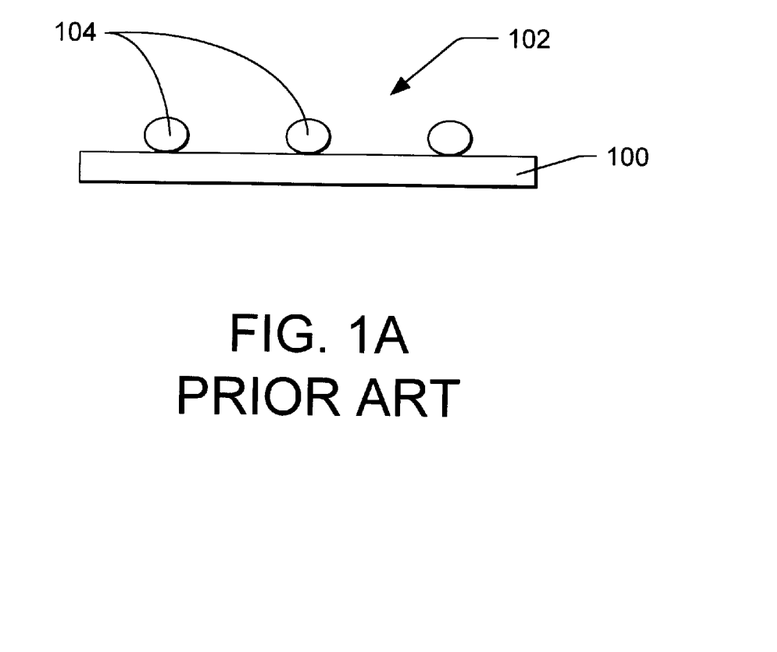
FIGS. 1A and B depict side cross-sectional views of stages in the packaging of a semiconductor flip chip.
Figure 1B:
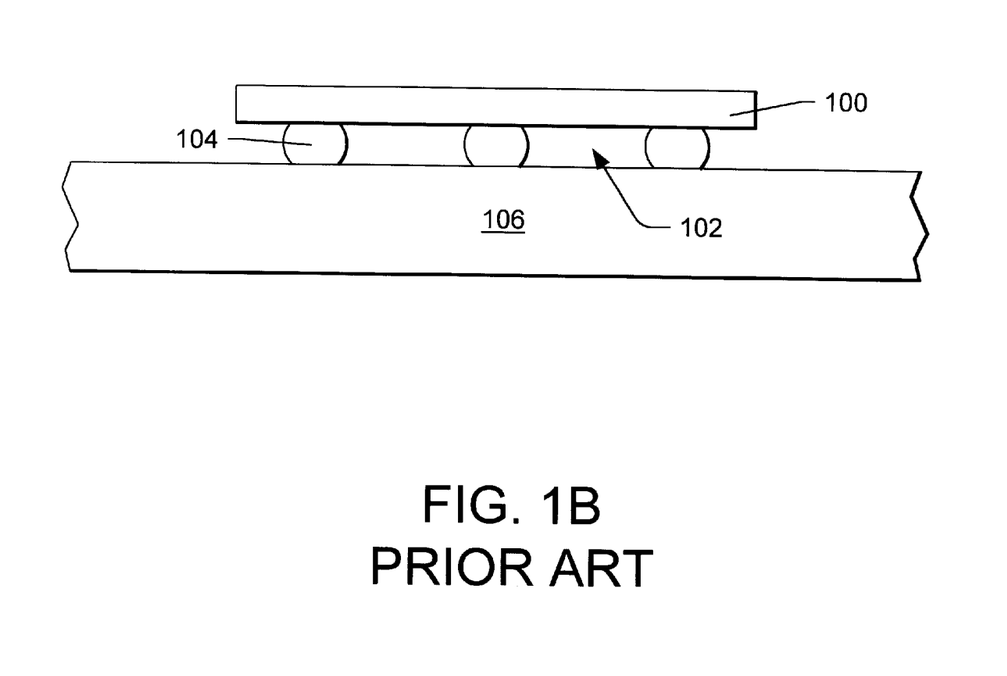

Briefly, FIGS. 1A and B illustrate the concept of flip chip packaging. As shown in FIG. 1A, following semiconductor processing, the completed die 100 has an active circuit surface 102 on which are arranged metal pads (not shown) connected to the circuitry of the die by electrical traces (not shown). Solder balls 104 are bonded to these metal pads in order to provide an electrical connection for a packaging substrate 106. The flip chip die 100 is assembled into a package by "flipping" it onto a packaging substrate and connecting the solder balls 104 on the die 100 to the substrate 106.

As shown in FIG. 1B, the die 100 is aligned with and placed onto a placement site on the packaging substrate 106 such that the die's solder balls 104 are aligned with electrical traces (not shown) on the substrate 106. The die 100 and/or the packaging substrate 106 are then heated, to a temperature of about 220° C. for example, causing the solder balls 104 to reflow and form electrical connections between the die 100 and the packaging substrate 106.

Subsequently, in conventional packaging procedures, this electrical connection is reinforced by mechanical connection of the die 100 to the substrate 106, typically using a thermally-cured epoxy underfill material (not shown). Further elements may also be added to the package to improve performance and reliability, for instance stiffeners and heat spreaders or heat sinks.

It should be noted that the foregoing figures are intended to be illustrative of the flip chip concept only and do not show all of the features of the die or packaging substrate, or the features in proportion with each other. For example, the solder balls 104 in proportion to the semiconductor die 100. In current designs, the die may have dimensions on the order of 0.5×0.5 inch (1 inch=2.54 cm) whereas the unbonded solder balls may have a diameter on the order of 4 to 5 mils (1 mil=$10^{-3}$ inch=0.0254 mm).

Figure 2A:
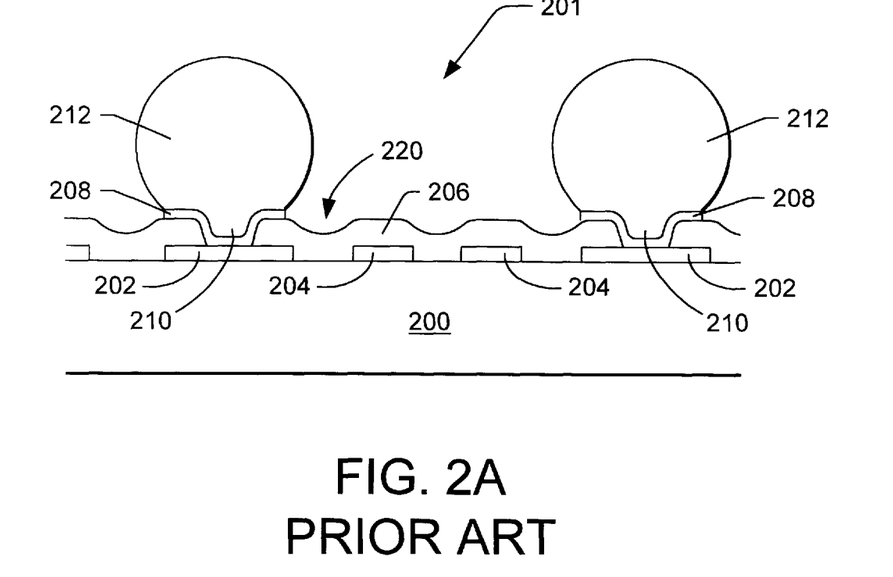
FIG. 2A depicts a side cross-sectional view of a portion of the active surface of a semiconductor flip chip having a conventional die metal layout suitable for a 252 $\mu$m die pitch typical in a 0.35 $\mu$m device size environment.

In a preferred embodiment, the present invention is directed to the metal layout on a semiconductor die which is used to define the connections between the die and a packaging substrate. FIG. 2A shows a cross-sectional view of a conventional surface structure of a semiconductor flip chip, for instance, in a 0.35 μm device size regime, prior to connection to a packaging substrate. The active surface 201 of the die 200 includes several metal pads 202, which are provided for supporting electrical connections between the die 200 and a packaging substrate (not shown), and a pattern of electrically conductive metal traces 204 which provide contacts between the pads 202 and input/output (I/O) slots on the die periphery (not shown). The die surface pads 202 and traces 204 are typically made of a patterned layer of aluminum or an aluminum alloy, such as aluminum copper (AlCu). The surface metal pads 202 are typically substantially octagonal in shape and about 105 to 130 μm wide. The metal traces 204 running from the metal pads 202 to the I/O slots at the periphery of the die 200, and are typically about 10 to 20 μm wide.

Following patterning of the surface metal pads 202 and traces 204 a passivation layer 206 composed of a dielectric material is deposited. Typically, the passivation layer 206 is composed of an oxide or nitride, such as silicon nitride, which is substantially conformally deposited, typically by chemical vapor deposition. A second level of metal pad, referred to as the "under bump metal pad" 208 ("UBM") is then deposited over the surface metal pads 202, connecting to them through a via 210 which is etched, for example, in the passivation layer 206 over a surface metal pad 202. The UBM 208 is typically composed of a plurality of layers. For example, a conventional UBM may be composed of a layer of copper (Cu), followed by a layer of nickel (Ni), and topped-off by a layer of gold (Au). A typical UBM is circular or hexagonal in shape and has a maximum span of about 5 to 20 μm less than the surface metal bump to which it is attached; about 100 to 110 μm. Solder bumps 212 are then attached to the UBMs 208 according to techniques well known in the art.

As semiconductor processing technology develops, semiconductor device size decreases, for example, from 0.35 μm to 0.25 μm transistor gate width and smaller, allowing the same number of devices to be placed on smaller dies. As noted above, metal traces 204 run from surface metal pads 202 to I/O slots (not shown) at the periphery of the die 200. Current designs for semiconductor dies have rows of six (6) surface metal pads 202. Four of the pads 202 are connected to one I/O slot each. The other two are connected to Vss and Vdd, respectively. As die sizes decrease, the width of I/O slots must correspondingly decrease. The width of an I/O slot defines the die's pitch, that is the spacing between rows of surface metal pads 202 on the die's active surface 201. In conventional 0.35 μm device size flip chips, I/O slots are typically about 63 μm wide; therefore the pitch of the metal pad rows on these chips is about 252 μm (4×63 μm). Therefore, the maximum allowable width of the surface metal pads 202 and the metal traces 204 on the chip, including appropriate spacing of about 2 to 5 μm to prevent shorting, is about 252 μm.

Improvements in process technology have recently made 0.25 μm semiconductor devices viable. The corresponding decrease in the die size has resulted in the development of narrower I/O slots. As an example, I/O slots about 50 μm wide have been developed for 0.25 μm device size dies. As a result, die pitch for such chips has been reduced to about 200 μm (4×50 μm).

In order to accommodate such decreased pitch, current surface metal pad 202 and/or metal trace widths must be reduced, since any substantial further reduction in the space between pads and traces risks shorts and failure of the die 200. Reduction in the width of the metal traces 204 is undesirable since it results in increased electrical resistance. Therefore, it is preferable to reduce the width of the surface metal pads 202.

Figure 2B:
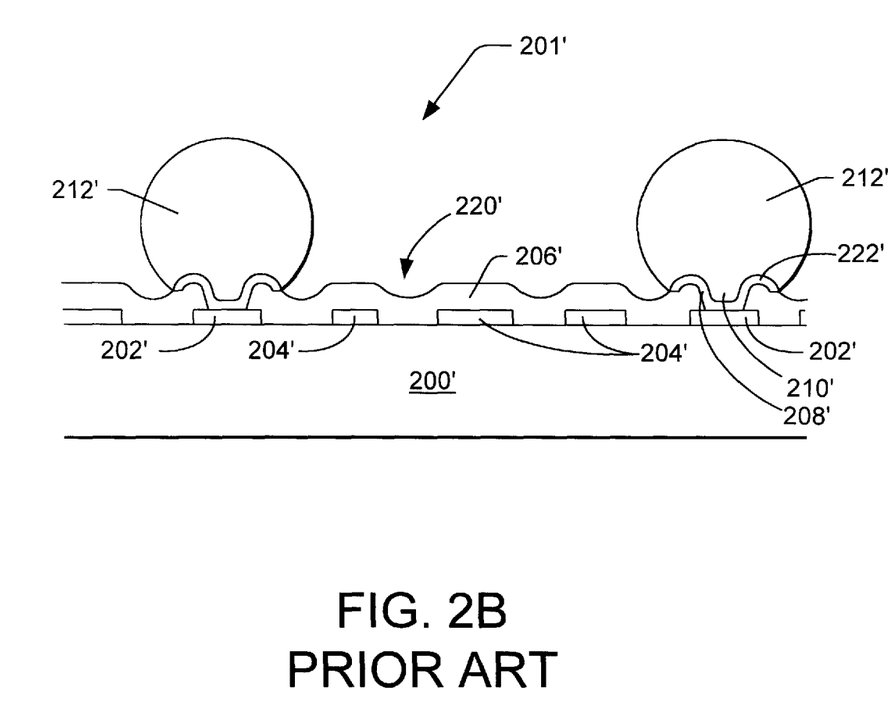
FIG. 2B depicts a side cross-sectional view of a portion of the active surface of a semiconductor flip chip having an otherwise conventional die metal layout adapted to about a reduced die pitch for a reduced device size environment, and showing the deformation in UBMs resulting from the narrowing of surface metal pads.

However, it has been discovered that reduction in the width of the surface metal pads produces stresses which may affect the reliability of the flip chip package. As shown in FIG. 2B, the surface metal pads 202' are reduced in size so that they are smaller (cover less die surface area) than the UBMs 208', while the width of the metal traces 204' is substantially unchanged. The narrowing of the metal pads 202' allows the combined width of the pads 202' and traces 204' to meet the reduced pitch requirement. But in the conventional configuration, with the traces outside of the die surface area covered by the UBM 208', the conformally deposited passivation material 206' will have indentations 220' between the surface metal pads 202' and the metal traces 204'. This is also true of the conventional structure depicted in FIG. 2A, however, whereas in the conventional structure the indentation 220 adjacent to a pad 202 is beyond the UBM 208 and does not affect its deposition, in the reduced pad size structure shown in FIG. 2B, the indentation 220' is underneath an outer portion 222' of the UBM 208'.

The UBM must be about the same size as in the conventional structure in order to reliably attach to and support a solder bump 212' of sufficient size to provide adequate space (about 70 to 90 $\mu$m) between the electrically bonded die 200 and substrate for subsequent effective dispensation of a mechanically bonding underfill material. When an indentation 220' is within the UBM deposition region, it provides in a non-planar deposition substrate. This results in curling of the outer portions 222' of the CVD deposited UBM 208' which is deposited in substantial conformity with the dielectric substrate 206'. Non-uniform stress may occur in a solder bump 212' without a substantially flat surface for attachment. Such non-uniform stress negatively affects the long term reliability of the solder bump connection.

Thus, it would be desirable to have a flip chip metal layout which is compatible with reduced die pitches resulting from reduced device size environments without a substantial increase in electrical resistance or reliability concerns due to uneven solder bump stress.

SUMMARY OF THE INVENTION

To achieve the foregoing, the present invention provides a semiconductor flip chip die metal layout which provides a flat UBM where surface metal pads are narrower than UBMs in order to accommodate decreased die pitch. This is achieved by depositing a metal region adjacent to and closely spaced from the pad which, together with the pad, is capable of providing a substrate that will result in a substantially flat passivation layer surface on which the UBM is subsequently deposited. The adjacent closely spaced metal region may be provided by bringing metal traces closer to a reduced size surface metal pad (into the die surface area underlying the UBM), and/or by depositing dummy metal similarly near the pad. The dummy metal may also be deposited over the whole chip surface area not occupied by other electrical components.

The invention provides a metal layout on a semiconductor die including a surface metal bonding pad, a metal region adjacent to the pad and spaced between about 1.0 and 3.0 $\mu$m from the pad, and an under bump metal pad overlying the surface metal pad and at least a portion of the adjacent metal region. The under bump metal pad is connected to the surface metal pad through a via. The adjacent metal region may include a metal trace and/or dummy metal. In a preferred embodiment the pad forms part of a row having a pitch of less than about 250 $\mu$m.

The invention further provides a method of providing a die metal layout on semiconductor flip chip. The method involves providing a semiconductor flip chip wafer fabricated to the pre-final metal layer step, depositing a metal layer on the wafer, and patterning the metal layer. The layer is patterned into features including a surface metal bonding pad, and a metal region adjacent to the pad and spaced about 1.0 to 3.0 $\mu$m from the pad. A dielectric layer is deposited over the patterned metal layer, and a via is etched through the dielectric layer to the surface metal pad. Then an under bump metal pad is deposited over the dielectric, overlying the surface metal pad and at least a portion of the adjacent metal region, and connected to the surface metal pad through the via in the dielectric.

These and other features and advantages of the present invention are described below with reference to the drawings.

DETAILED DESCRIPTION OF THE PREFERRED EMBODIMENTS

To achieve the foregoing, the present invention provides a semiconductor flip chip die metal layout which provides a flat UBM where surface metal pads are narrower than UBMs in order to accommodate decreased die pitch. This is achieved by depositing a metal region adjacent to and closely spaced from the pad which, together with the pad, is capable of providing a substrate that will result in a substantially flat passivation layer surface on which the UBM is subsequently deposited. The adjacent closely spaced metal region may be provided by bringing metal traces closer to a reduced size surface metal pad (into the die surface area underlying the UBM), and/or by depositing dummy metal similarly near the pad. The dummy metal may also be deposited over the whole chip surface area not occupied by other electrical components.

According to a preferred embodiment of the present invention, metal traces and/or dummy metal are deposited near surface metal pads which have been reduced in size in order to fit within the smaller pitch requirements of a reduced, for example 0.25 μm or smaller, device size environment. The additional closely spaced metal helps support that portion of the UBM which extends beyond the surface metal pad. More specifically, the additional closely spaced metal provides support for the passivation dielectric which is deposited between the two metal layers. Without the additional closely spaced metal, the substantially conformally deposited passivation layer has an indented surface adjacent to the surface metal pad which prevents flat deposition of the UBM. When the additional metal is deposited near the surface metal pad, the dielectric adjacent the surface metal pad and the UBM may be deposited substantially flat.

Figure 3:
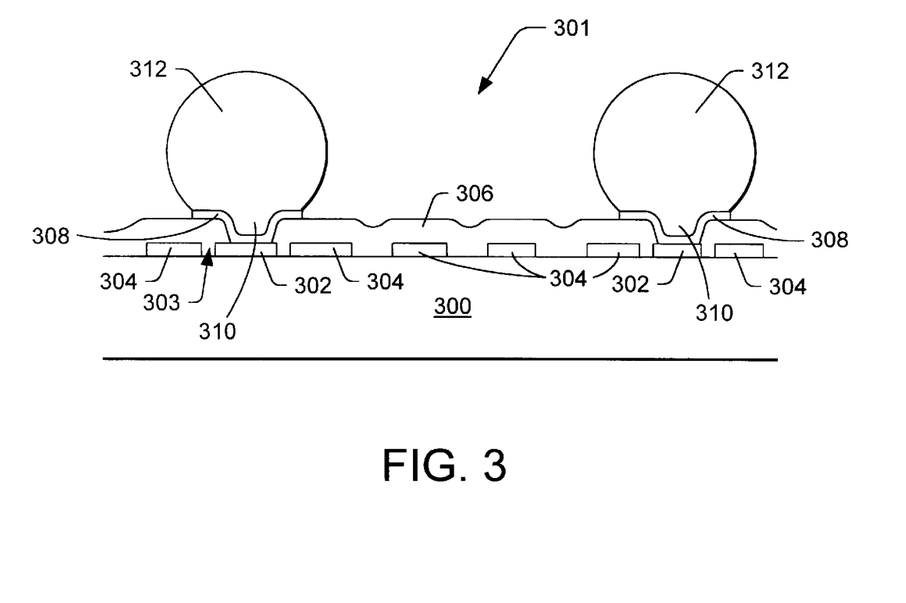
FIG. 3 depicts a side cross-sectional view of a portion of the active surface of a semiconductor flip chip having a die metal layout adapted to about a reduced die pitch for a reduced device size environment in accordance with a preferred embodiment of the present invention.

FIG. 3 shows a cross-sectional view of a portion of the surface structure of a semiconductor flip chip in accordance with a preferred embodiment of the present invention, for instance, in a 0.25 μm device size regime, prior to connection to a packaging substrate. As discussed above, I/O slots about 50 μm wide have been developed for 0.25 μm device size dies. As a result, die pitch for such chips has been reduced to about 200 μm (4×50 μm). Of course, the present invention may also be applicable to other device size regimes both larger and smaller than 0.25 μm.

As in the conventional structure, the surface 301 of the die 300 includes several metal pads 302, which are provided for supporting electrical connections between the die 300 and a packaging substrate (not shown), and a pattern of electrically conductive metal traces 304 which provide contacts between the pads 302 and I/O slots on the die periphery (not shown). The die surface pads 302 and traces 304 may be made of conventional conductive materials, such as a patterned layer of aluminum or an aluminum alloy, such as aluminum copper (AlCu). Other conductive materials which are capable of being patterned as described herein may also be used.

In a preferred embodiment, the surface metal pads 302 may be substantially square or octagonal in shape and maximally about 55 to 90 μm wide, more preferably about 60 to 90 μm wide, and most preferably about 80 μm wide. Also in a preferred embodiment, the metal traces 304 which run from the metal pads 302 to I/O slots (not shown) at the periphery of the die 300, are not substantially narrowed from their 0.35 μm device size environment and may be about 10 to 20 μm wide. However, the metal traces 304 are moved closer to the metal pads 302, so that the space between them 303 is preferably within about 1.0 to 3.0 μm, more preferably about 1.5 to 2.5 μm, most preferably about 2 μm. In this way, at least a portion of the metal traces 304 adjacent to the metal pads 302 will underlie and help support the UBM 308, as described more fully below.

Following deposition and patterning of the surface metal pads 302 and traces 304, a passivation layer 306 composed of a dielectric material may be deposited. The passivation layer 306 may be composed of conventional dielectric materials such as oxide, nitride, or oxynitride. Silicon nitride, for example, may be substantially conformally deposited, for example, by chemical vapor deposition (CVD). As shown in FIG. 3, the space between the metal pads 302 and the adjacent metal traces 304 is preferably within about 1.0 μm to 3.0 μm. In this configuration, the conformally deposited passivation material 206 will not have indentations between the surface metal pads 302 and the metal traces 304, since the pad-trace spacing is insufficient to cause an indentation to be formed during CVD dielectric deposition.

UBMs are then deposited over the surface metal pads 302, connecting to them through vias 310 which is etched, for example, in the passivation layer 306 over a surface metal pad 302. In a preferred embodiment, a UBM 308 may be composed of a plurality of layers. For example, a conventional UBM structure composed of a layer of copper (Cu), followed by a layer of nickel (Ni), and topped-off by a layer of gold (Au) may be used. As in conventional structures, a UBM 308 may be circular, hexagonal or octagonal in shape, for example, and have a span sufficient to reliably attach to an adequately-sized solder bump 312, as discussed above. A UBM 308 according to a preferred embodiment of the present invention may then have substantially the same dimensions as a conventional UBM in a 0.35 μm device size environment, preferably about 90 to 110 μm, more preferably about 100 to 90 μm. Solder bumps 312 may then be attached to the UBMs 308, for example, by conventional methods well known in the art.

In some configurations, there may be regions on a flip chip die adjacent to a die surface metal pad which have no metal trace, or which have a metal trace which is not wide enough to fully support the UBM. In these situations, "dummy metal", that is preferably metal material which is not electrically connected to active electrical elements of the die, may be deposited adjacent to the surface metal pad or metal trace to enlarge the support surface for the UBM. The "dummy metal" may also be composed of materials other than metal that can provide support for the UBM. However, it is preferable to use the same metal as is used in the surface pads and traces since all three metals can then be deposited and patterned together efficiently, and will all have the same coefficient of thermal expansion, which will reduce stresses and improve reliability in the completed package.

Figure 4A:
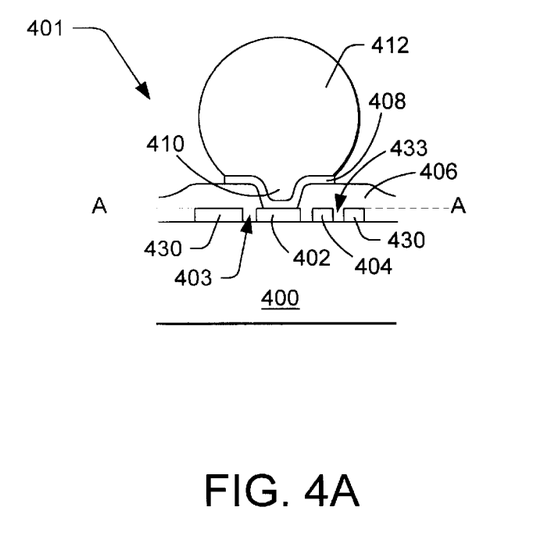
FIG. 4A depicts a side and cross-sectional view of a portion of the active surface of a semiconductor flip chip having a die metal layout adapted to about a reduced die pitch for a reduced device size environment in accordance with an alternative preferred embodiment of the present invention.

FIG. 4A shows a side cross-sectional view of a portion of the active surface of a semiconductor flip chip having a die metal layout in accordance with a preferred embodiment of the present invention. A metal layer is deposited and patterned on the die surface 401. This layer includes surface metal pads 402, metal traces 404 which connect the pads to I/O slots at the die periphery (not shown), and dummy metal 430 which expands the support for the subsequently deposited UBM 408. These three metal components are close enough to each other (preferably within about 1.0 μm to 3.0 μm) to prevent the formation of any indentations due to the spaces 403 and 433 between them when a passivation dielectric 406 is deposited over them. The resulting surface provides a substantially flat deposition substrate for the UBM 408 which is deposited over the passivation layer 406 overlying the region of the pad 402 and connected to the pad through a via 410 etched, for example, in the passivation layer prior to UBM deposition. A solder bump 412 may then be attached to the UBM 408, for example, by conventional methods well known in the art.

Figure 4B:
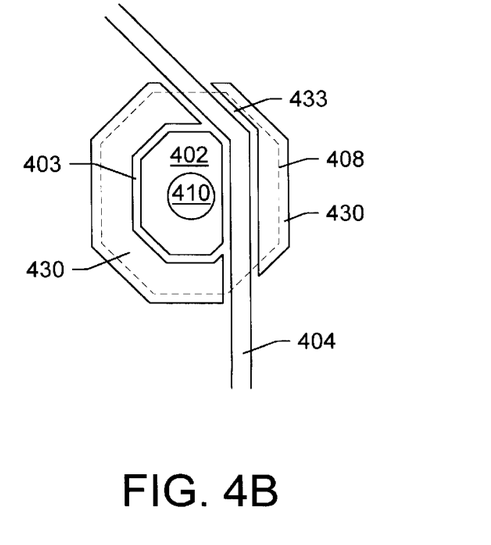
FIG. 4B depicts a top cross-sectional view (A—A) of the portion of the active surface of the semiconductor flip chip shown in FIG. 4A.

FIG. 4B shows a top cross-sectional view (A—A) of the portion of the active surface of the semiconductor flip chip shown in FIG. 4A, with the maximum extent of the UBM 408, which is above the plane of this view, depicted in broken lines. This view shows the octagonal shape of both the surface metal 402 and the UBM 408. The pad 402 is substantially ringed by dummy metal 430, adjacent to the pad 402 on the top, left side and bottom. A metal trace 404 skirts the right side of the pad 402, and dummy metal completes the UBM support on the far side of the trace 404.

It should be understood that many configurations using additional metal to provide adequate support for a UBM deposited over a die surface metal pad which has been reduced in size may be used in accordance with the present invention. As described above, the additional metal may be in the form of traces and/or dummy metal, or other suitable materials which may be deposited close to a surface metal pad. The use of dummy metal may also be expanded beyond the region underlying the UBM to cover larger unused areas of the die's active surface.

Figure 5:
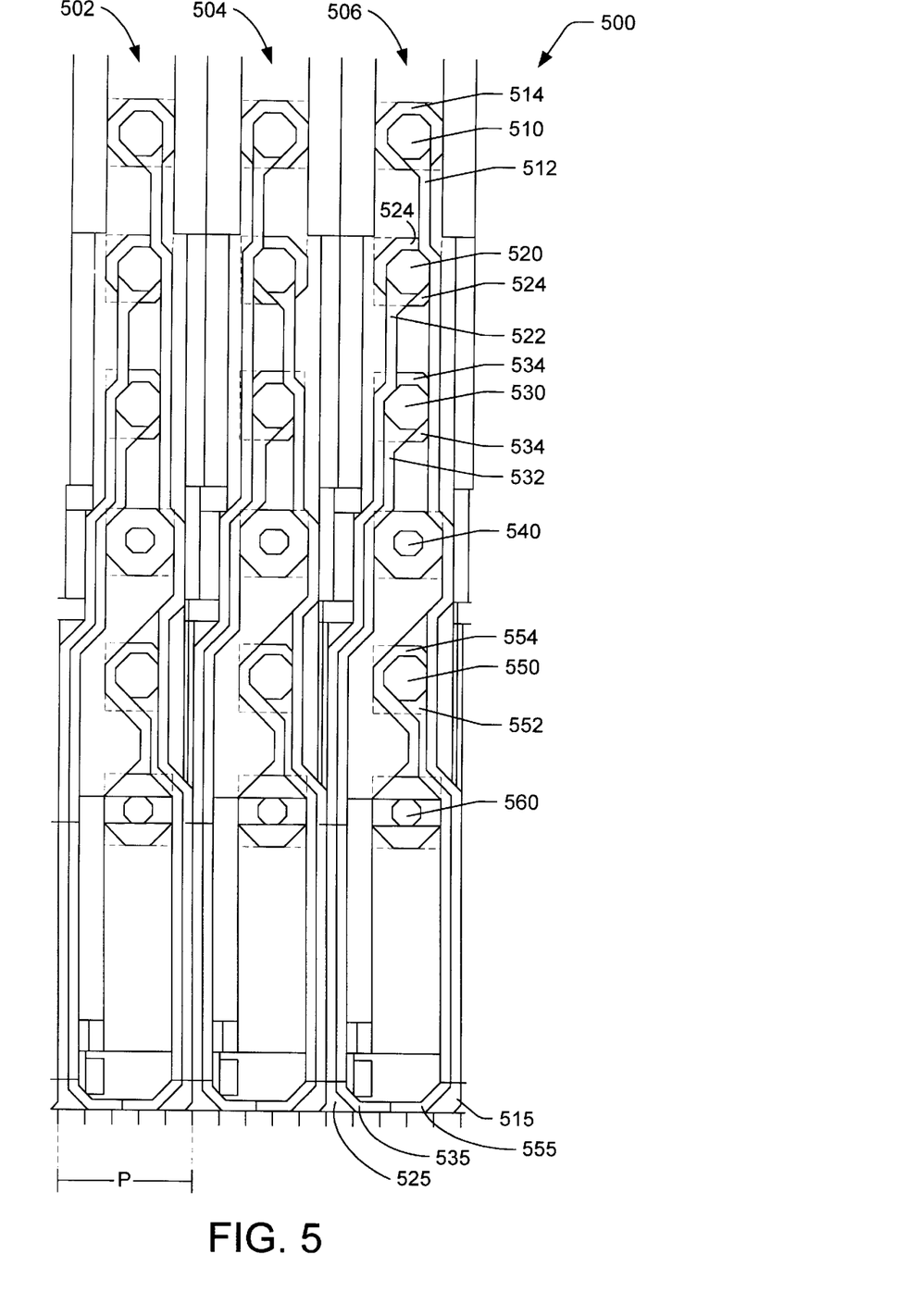
FIG. 5 depicts a top schematic view of a portion of a test vehicle for a semiconductor flip chip die metal layout in accordance with an preferred embodiment of the present invention.

FIG. 5 shows a schematic of a portion of a test vehicle showing implementation of a die metal layout in accordance with a preferred embodiment of the present invention. The test vehicle portion 500 represents a portion of the active surface of a semiconductor flip chip die showing the configuration of three rows 502, 504 and 506, respectively, of surface metal pads with their metal trace connections to I/O slots. The pitch (P) of a row is illustrated on row 502.

Taking another row as an example, the row 506 contains six surface metal pads 510, 520, 530, 540, 550 and 560. Pad 510 is connected to a trace 512 which leads to an I/O slot 515, and is otherwise surrounded by dummy metal 514 to provide support for the UBM (not shown) associated with the pad 510. Pad 520 is connected to a trace 522 which leads to an I/O slot 525, and is otherwise surrounded by a combination of trace 512 (on its right side, as depicted) and dummy metal 524 to provide support for the UBM (not shown) associated with the pad 520. Pad 530 is connected to trace 532 which leads to an I/O slot 535, and is otherwise surrounded by a combination of trace 512 (on its right side, as depicted), trace 522 (on its left side, as depicted) and dummy metal 534 to provide support for the UBM (not shown) associated with the pad 530. Pad 540 is connected to Vdd. Pad 550 is connected to trace 552 which leads to an I/O slot 555, and is otherwise surrounded by a combination of trace 512 (on its right side, as depicted) and dummy metal 554 to provide support for the UBM (not shown) associated with the pad 550. Pad 560 is connected to Vss.

Figure 6:
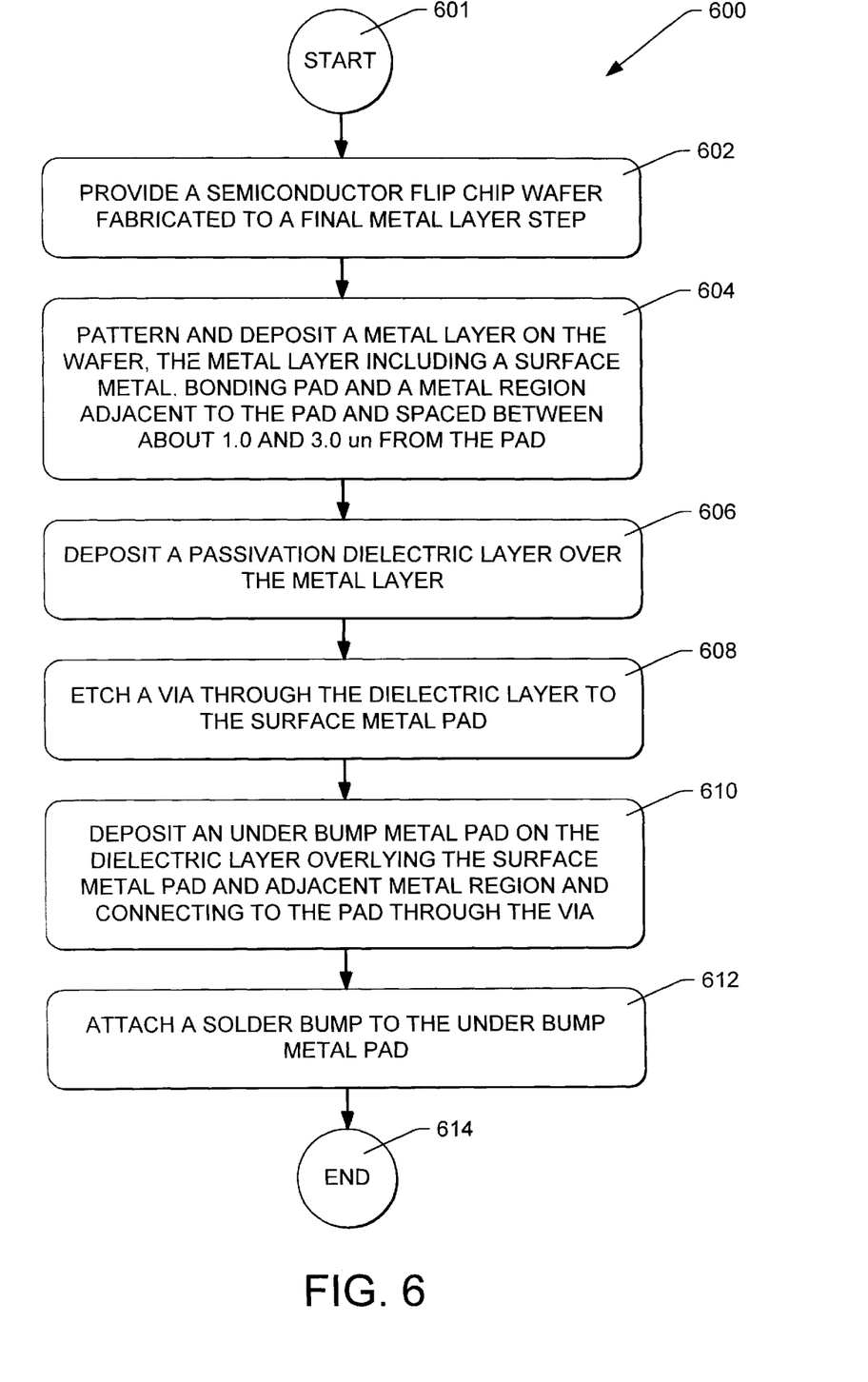
FIG. 6 depicts a flow chart showing steps in a method of depositing a semiconductor flip chip die metal layout in accordance with a preferred embodiment of the present invention.

FIG. 6 shows a flow chart 600 of a preferred embodiment of a process for providing a die metal layout on semiconductor flip chip according to the present invention. The process begins at 601, and at a step 602 a semiconductor flip chip wafer fabricated to the point of the pre-final metal layer step is provided. The present invention involves replacement of a conventional layout of a final flip chip metal layer with a layout that is adapted to a reduced metal bonding pad row pitch, such as about 200 μm. At a step 604, a metal layer is deposited and patterned on the wafer according to conventional techniques well known in the art, such as photolithography and sputtering. The metal layer includes one or more surface metal bonding pads between about 55 and 90 μm in their maximum extent and a metal region adjacent to the pad and spaced between about 1.0 and 3.0 μm from the surface metal pad. The adjacent metal region may include one or more metal traces and/or dummy metal regions.

At a step 606, a passivation dielectric layer is deposited over the metal layer, including the surface metal pad and adjacent metal region. Then, at a step 608 a via is etched through the dielectric layer to the surface metal pad, and, at a step 610, an under bump metal pad ("UBM") is deposited on the dielectric overlying the surface metal pad and at least a portion of the adjacent metal region. The UBM is connected to the surface metal pad through the via in the dielectric layer.

As noted above, the UBM may be composed of a plurality of individually deposited layers. For example, in a preferred embodiment, a UBM 308 may be composed of a plurality of layers. For example, a conventional UBM structure composed of a layer of copper (Cu), followed by a layer of nickel (Ni), and topped-off by a layer of gold (Au) may be used. As in conventional structures, a UBM may be circular, hexagonal or octagonal in shape, for example, and have a span sufficient to reliably attach to an adequately-sized solder bump, as discussed above. A UBM according to a preferred embodiment of the present invention may then have substantially the same dimensions as a conventional UBM in a 0.35 μm device size environment, preferably about 90 to 110 μm, more preferably about 100 to 90 μm.

At a step 612, a solder bump is attached to the UBM, for example, by conventional methods well known in the art. The process ends at 614.

It should be understood that the flow chart of FIG. 6 represents only one preferred embodiment of the present invention. Other process embodiments having fewer or additional steps are also possible within the scope of the present invention. For example, the flip chip wafer may be subsequently cut into individual dies following electrical testing.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope of the appended claims.

What is claimed is:

1. A metal layout on a semiconductor die, comprising:
   a surface metal bonding pad;
   a metal region adjacent to said pad and spaced between about 1.0 and 3.0 μm from said pad; and
   an under bump metal pad overlying said surface metal pad and at least a portion of said adjacent metal region, and connected to said surface metal pad through a via.

2. The metal layout of claim 1, wherein said adjacent metal region comprises a metal trace.

3. The metal layout of claim 1, wherein said adjacent metal region comprises dummy metal.

4. The metal layout of claim 1, further comprising a solder ball attached to said under bump metal pad.

5. The metal layout of claim 1, further comprising a dielectric layer deposited over said surface metal pad and adjacent metal region.

6. The metal layout of claim 1, wherein said surface metal pad is between about 55 and 90 μm at its maximum extent.

7. The metal layout of claim 1, wherein said metal region adjacent to said pad is spaced between about 1.5 and 2.5 μm from said pad.

8. The metal layout of claim 1, wherein said metal region adjacent to said pad is spaced about 2.0 μm from said pad.

9. The metal layout of claim 1, wherein said adjacent metal region comprises one or more metal traces and one or more dummy metal regions.

10. The metal layout of claim 1, wherein said pad forms part of a row having a pitch of less than about 250 μm.

11. The metal layout of claim 1, wherein said semiconductor die comprises transistors having about a 0.25 μm gate width.

12. The metal layout of claim 6, wherein said surface metal pad is between about 60 and 90 μm at its maximum extent.

13. The metal layout of claim 12, wherein said surface metal pad is about 80 μm at its maximum extent.

14. The metal layout of claim 9, wherein each of said traces and dummy metal regions are separated from each other by between about 1.0 and 3.0 μm.

15. The metal layout of claim 10, wherein said pad forms part of a row having a pitch of about 200 µm.

16. A metal layout on a semiconductor die, comprising:

a surface metal bonding pad;

means adjacent to said pad and spaced between about 1.0 and 3.0 µm from said pad for supporting an under bump metal pad; and an under bump metal pad overlying said surface metal pad and at least a portion of said supporting means, and connected to said surface metal pad through a via.

17. A metal layout on a semiconductor die, comprising:

a surface metal bonding pad;

a metal region laterally adjacent to and spaced apart from said surface metal pad, said adjacent metal region;

a solder ball-supporting under bump metal pad overlying said surface metal pad and at least a portion of said adjacent metal region, said under bump metal pad separated from said surface metal pad and said adjacent metal region by only a single layer of dielectric, and connected to said surface metal pad through a via.

18. The metal layout of claim 17, wherein said adjacent metal region comprises a metal trace.

19. The metal layout of claim 17, wherein said adjacent metal region comprises dummy metal.

20. The metal layout of claim 17, wherein said layer comprises a dielectric layer deposited over said surface metal pad and adjacent metal region.

21. The metal layout of claim 17, wherein the spacing between the surface metal pad and the adjacent metal region is between about 1.0 and 3.0 µm.

* * * * *